United States Patent
Goto et al.

(10) Patent No.: US 11,879,943 B1
(45) Date of Patent: Jan. 23, 2024

(54) METHOD AND APPARATUS FOR PREDICTING FAILURE OF A COMPONENT

(71) Applicant: Keysight Technologies, Inc., Santa Rosa, CA (US)

(72) Inventors: Masaharu Goto, Hanno (JP); Kiyoshi Chikamatsu, Tokyo (JP); Naoki Kobayashi, Machida (JP)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/334,929

(22) Filed: May 31, 2021

(51) Int. Cl.
    *G01R 31/327*    (2006.01)
    *G06F 17/14*    (2006.01)

(52) U.S. Cl.
    CPC .......... *G01R 31/3278* (2013.01); *G06F 17/14* (2013.01)

(58) Field of Classification Search
    CPC ........................... G01R 31/3278; G06F 17/14
    See application file for complete search history.

(56) References Cited

U.S. PATENT DOCUMENTS

| | | | |
|---|---|---|---|
| 10,958,362 B1 | 3/2021 | Owen | |
| 2010/0325132 A1* | 12/2010 | Liu | G06F 16/24568 707/769 |
| 2013/0162437 A1* | 6/2013 | Sun | G01R 31/52 340/664 |
| 2017/0308505 A1* | 10/2017 | Ni | G06F 17/10 |
| 2017/0344909 A1* | 11/2017 | Kurokawa | G05B 23/024 |
| 2020/0258632 A1* | 8/2020 | Soni | G06K 9/6215 |
| 2020/0320084 A1 | 10/2020 | Goto | |
| 2021/0004639 A1 | 1/2021 | Kobayashi | |
| 2022/0155769 A1* | 5/2022 | Zhou | G05B 23/0243 |

OTHER PUBLICATIONS

"A Hybrid Prognostics Methodology for Electronic Products", Sachin Kumar et al., IEEE, 2008 International Joint Conference on Neural Networks ()IJCNN 2008). (Year: 2008).*
Goto, et al., Scaling Up Heterogeneous Waveform Clustering for Long-Duration Monitoring Signal Acquisition, Analysis, and Interaction: Bridging Big Data Analytics with Measure instrument Usage Pattern, 2019 IEEE International Conference on Big Data, Dec. 9-12, 2019, pp. 1794-1803.

* cited by examiner

*Primary Examiner* — Catherine T. Rastovski
*Assistant Examiner* — Lal C Mang

(57) ABSTRACT

A system for detecting changes in an electronic component and a method for operating a data processing system for finding events that predict an electronic component's failure are disclosed. The system includes an input port that receives a data stream that includes an ordered sequence of data values generated by the electronic component. A controller identifies a segment of the data stream (EDS), transforms the EDS to a CSV, and compares the CSV to a plurality of reference signature vectors (RSVs) to determine if the CSV is similar to any of the RSVs. Information identifying a new CSV is stored in an RSV database if the new CSV is similar to one of the RSVs, and a new RSV is created if the new CSV is not similar to any of the RSVs in said RSV database. A predictor RSV that occurs as the electronic component ages is identified.

13 Claims, 4 Drawing Sheets

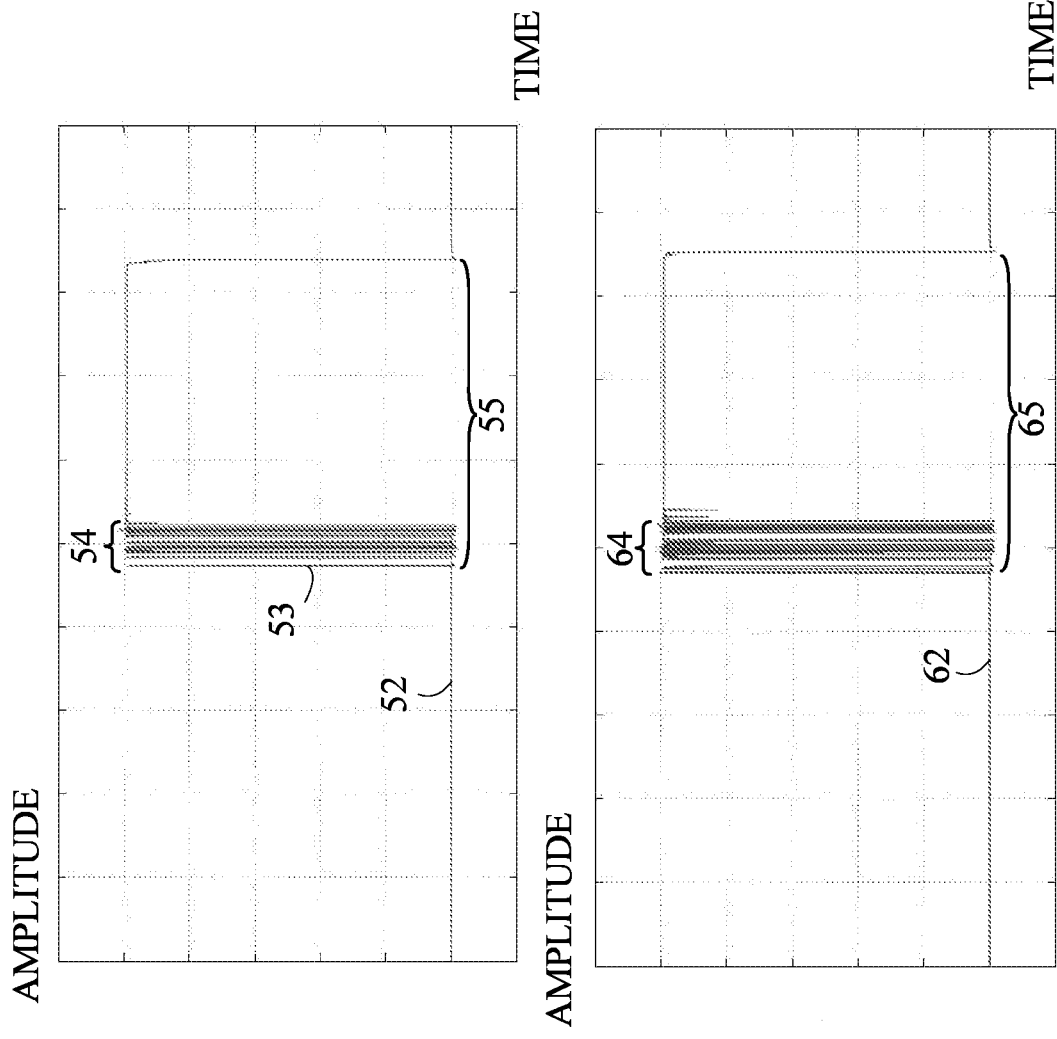

METHOD AND APPARATUS FOR PREDICTING FAILURE OF A COMPONENT

BACKGROUND

Predicting the failure of an electrical or electro-mechanical component that is integrated in a larger system poses significant challenges. If the component fails during the operation of the larger system, the cost of replacing the component during the operation of the system, as opposed to during the maintenance periods assigned to the system, can be significant both in terms of cost and downtime of the larger system. Ideally, an analysis of the output of the system or component during its operation would detect anomalies that indicate that the component is likely to fail. Given such failure notices, the component can be replaced when the system is down for routine maintenance.

SUMMARY

A system for detecting changes in an electronic component and a method for operating a data processing system for finding events that predict an electronic component's failure, are disclosed. The system includes an input port adapted for receiving a data stream. The data stream includes an ordered sequence of data values generated by the electronic component. The system also includes a controller that identifies a segment of the data stream, referred to as a new extracted data segment (EDS) using an extraction protocol, transforms the EDS to a clustering signature vector (CSV), and compares the CSV to each of a plurality of reference signature vectors (RSVs) using a first similarity protocol to determine if the CSV is similar to any of the RSVs. The controller stores information identifying a new CSV in an RSV database if the new CSV is similar to one of the RSVs, and creates a new RSV if the new CSV is not similar to any of the RSVs in said RSV database. The controller identifies a predictor RSV that occurs as the electronic component ages.

In one aspect, the controller transforms the CSV corresponding to the EDS to that EDS.

In one aspect, the controller transforms the EDS by applying a Fourier Transform to the EDS.

In one aspect, the data stream includes a first period in which the electronic component is known to be operating correctly and a subsequent period in which the predictor RSV occurs. In one example, the data sequence is divided into a plurality of contiguous intervals and in which each RSV is characterized by a count function that depends on a number of CSVs that were found to be similar to that RSV in each of the contiguous intervals, the predictor RSV having a count function that increases as a function of position in the data stream.

In one aspect, the electronic component fails and the controller identifies one of the RSVs that occurred within a predetermined time period of the electronic component failure.

In one aspect, the EDSs identified by the extraction protocol includes selecting a fixed number of the data values from the sequence including a data value associated with a trigger value specified by the extraction protocol.

In one aspect, the ordered sequence of data values is copied to a storage medium and the system stores a location of each EDS in the storage medium.

The method for operating a data processing system for finding events that predict an electronic component's failure includes extracting a plurality of EDSs from a data stream which includes an output of the electronic component as a function of time, each EDS satisfying an extraction protocol and being characterized by a time stamp indicating a time at which the EDS was present. The data processing system transforms each EDS to a corresponding CSV and clusters the CSVs into a plurality of clusters. Each cluster is characterized, a number of CSVs in that cluster, and a range of time stamps for the CSVs in that cluster. The clustering is determined by a similarity protocol. The data processing system identifies a predictor cluster that is different from clusters whose CSVs have time stamps during a period in which the electronic component is not defective, the predictor cluster having more than a predetermined numbers of CSVs.

In one aspect, each cluster is represented by an RSV and wherein the electronic component fails and the data processing system determines a predictor cluster by examining the clusters within a pre-failure period includes the CSVs having time stamps within the pre-failure period prior to the failure that belongs to clusters that having RSVs that are not similar to RSVs associated with the period in which the electronic component is not defective.

In one aspect, the extraction of the plurality of EDSs includes receiving the data stream in real time from the electronic component and clustering the CSVs in real time, the data processing system notifying a user when one of the clusters having an RSV that is not similar to the RSVs of clusters having time stamps during a period in which the electronic component is not defective, has more than a predetermined number of CSVs in that cluster.

In one aspect, the data stream is divided into a plurality of contiguous intervals and in which each RSV is characterized by a count function that depends on a number of CSVs that were found to be similar to that RSV in each of the contiguous intervals, the predictor cluster having a count function that increases as a function of position in the data stream.

In one aspect, the EDSs identified by the extraction protocol includes selecting a fixed number of the data values from the data stream including a data value associated with a trigger value specified by the extraction protocol.

In one aspect, transforming the EDSs to the CSVs includes setting each CSV to the corresponding EDS.

In one aspect, transforming the EDSs to the CSVs includes transforming each EDS via a Fourier transformation.

BRIEF DESCRIPTION OF THE DRAWINGS

FIGS. 2(A)-2(C) illustrate three reference data segments (RDSs) for three different clusters of EDSs that are observed when monitoring the output of the relay.

DETAILED DESCRIPTION

Figure 1:
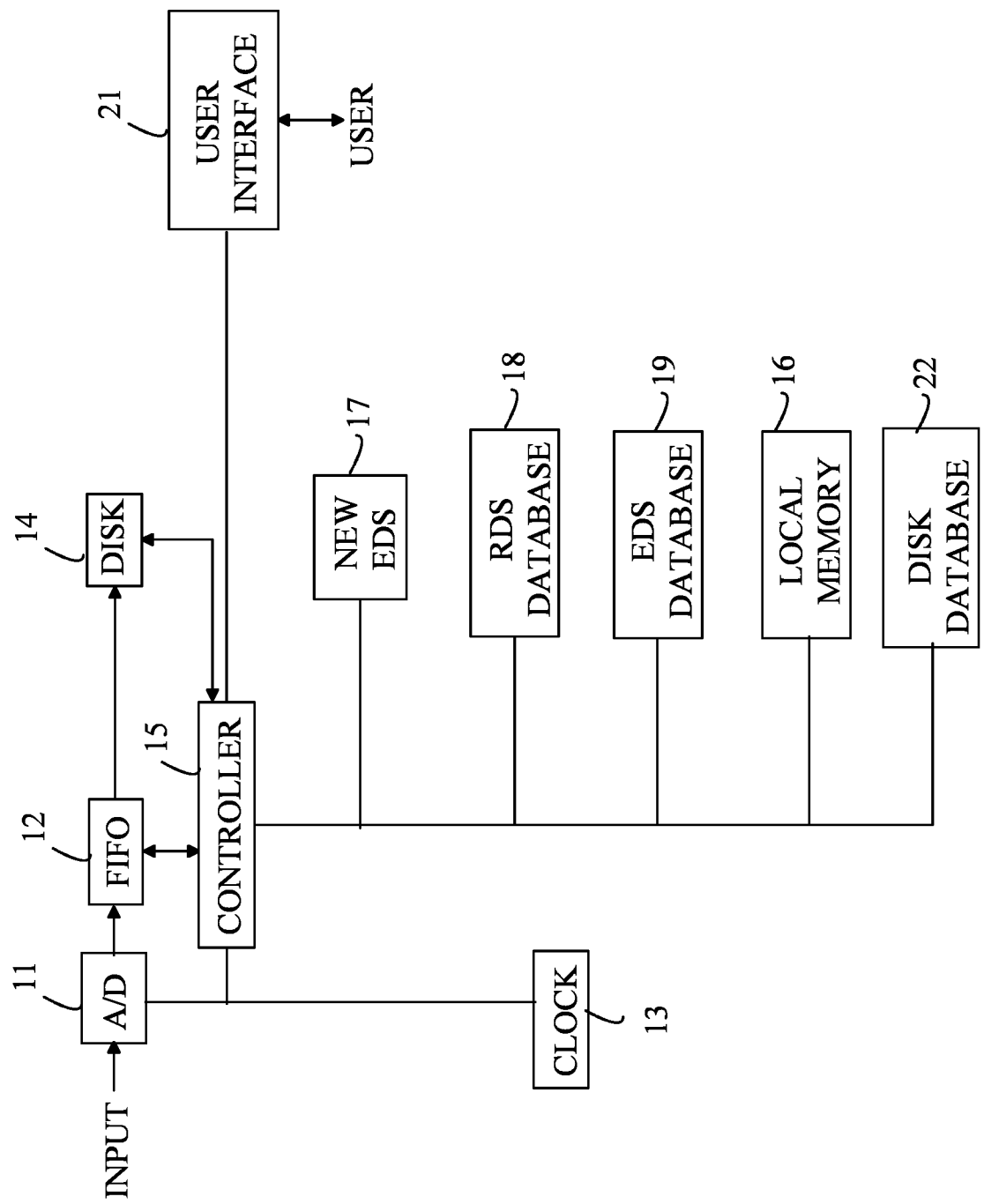
FIG. 1 illustrates an exemplary data recording apparatus that can be used with the failure prediction system of the present disclosure.

The manner in which a fault prediction system according to the present disclosure provides its advantages can be more easily understood with reference to a simple example. Consider the case of an electronic component whose output is monitored by the fault prediction system. For the purposes of this example, it will be assumed that early in the monitoring, the component is in good condition and not near failure. In general, the output of the component will be associated with a change in a signal value that can be used to define a trigger for an event of interest. Normally, the output of the component is recorded to a mass storage device such as a disk drive. Assume that the trigger is generated when the component turns on, and its output is greater than some predetermined threshold value. When a trigger is generated, the fault prediction system records the output of the component in a time window that includes the trigger event. An EDS can be referenced by its storage location in the mass storage device. In one aspect, a database records information about each EDS, but does not store the EDS. When the EDS is needed for further processing, it is retrieved from a mass storage device using the storage location provided by the database.

Ideally each EDS would contain the data samples corresponding to one signal of interest without any background samples. However, the need to identify the EDS in a short period of time constrains the extraction algorithm. To find the precise signal segment of interest requires significantly more time than detecting the beginning of the signal by an easily detectable event such as a rising or falling edge across a defined threshold level. The end of the signal is set to a fixed number of samples relative to the beginning of the signal. If two signals were in fact the same, the EDSs for the two signals would still match. Hence, in one aspect of the system, the extraction algorithm specifies a trigger condition that defines the start of the EDS and the end of the EDS is defined to be a fixed number of input samples relative to the start of the EDS. If this approximation interferes with the final clustering discussed below, the EDSs can be retrieved from the long-term storage and a clustering based on a more exact end of the signal can be utilized, as described below.

In one aspect of a failure prediction according to the present disclosure, the EDSs are subjected to a clustering algorithm to identify classes of EDSs. The classes identified during the early life of the component represent the normal operation of the component. As the component ages, new classes of EDSs will be seen. The manner in which the presence of the new classes can be utilized depends on the manner in which the failure prediction system is to operate.

For example, if the recording is continued until the component actually fails, a review of the EDSs that appear late in the product's lifetime can provide predictors for failures if enough components are monitored until failure. The classes that appear within some predetermined time period before failure, but were not part of the classes observed during the earlier operation of the component when the component was presumably not failing could be used to create a failure likely signal. In another example, the presence of new classes as the component ages may be sufficient to determine that the component is changing, and hence, should be examined or replaced depending on the criticality of the component in the system in which it is embedded.

In one aspect, the output of the electrical component is monitored by recording the system that digitizes the output of the electronic component and feeds the digitized data stream into a buffer. When an EDS is encountered, the EDS is copied to the buffer for further examination and assigned an index value that uniquely identifies the EDS in terms of the location of the EDS in the data stream. The buffer is logically a FIFO buffer. The output of the FIFO buffer is copied to a mass storage device such a disk drive.

A "similarity measure" is also defined for the EDSs by a similarity algorithm. The similarity measure reflects the degree of similarity between any two extracted data segments. The similarity measure allows the system of the present disclosure to group EDSs into clusters of EDSs that are similar to one another. In one aspect, the similarity algorithm includes a threshold value. If the similarity measure has a predetermined relationship with a threshold value, the two EDSs are defined to be similar to one another. For example, the two EDSs could be defined to be similar to one another if the similarity measure is less than the threshold value.

When a new EDS is found, the system determines whether the EDS is part of a cluster that has already been found. If the EDS is part of an existing cluster, the existing cluster is updated to reflect the addition of the new EDS. If the EDS is not sufficiently similar to any of the existing clusters, a new cluster is defined and the EDS is added to that cluster.

In one aspect, each cluster is represented by an RDS. The extraction and clustering are performed in real time during the recording, and hence, a user can view clusters of EDSs that are present in the data stream without the need to recover the EDSs from the now-stored data stream. During the data recording and initial clustering, only the new EDS identified in the data stream is retained in memory. To facilitate the clustering operation, the RDSs are kept in the system memory. After the recording of the data stream has been completed, the clustered EDSs can be recovered and used for further classification.

Refer now to FIG. 1, which illustrates an exemplary data recording apparatus that can be used with the failure prediction system of the present disclosure. An incoming data stream is digitized by analog-to-digital converter (ADC) 11 whose output is stored in a local FIFO buffer 12. It should be noted that FIFO buffer 12 may be implemented in local memory 16. One sample is digitized for each clock cycle from clock 13. Controller 15 maintains an internal register that is incremented at each clock cycle, and provides a unique index for identifying a data segment that begins with the data sample just transferred to FIFO buffer 12. The new data entry is transferred to FIFO buffer 12 and the oldest entry in FIFO buffer 12 is read out on each cycle of clock 13. On each clock cycle, controller 15 determines if a data segment of interest has begun or is now completed. Controller 15 can include hardware to detect the beginning of a data segment of interest or controller 15 can examine the contents of FIFO buffer 12 to determine if a data segment of interest has begun or is now completed. Hardware triggers are used in the oscilloscope arts and known to those skilled in the art. If a data sequence of interest is now within the FIFO buffer 12, controller 15 copies that data sequence from the FIFO buffer to a new EDS buffer 17, notes the location of the new EDS in the data stream and enters that information in an EDS database 19.

To facilitate the retrieval of the EDS from disk 14, a disk database 22 records the correspondence between records on disk 14 and the indices assigned to the beginnings of each EDS. In general, disk 14 is organized as a plurality of disk records that can be randomly accessed. If controller 15 needs to recover an EDS that is stored on disk 14, disk database 22 is used to determine the disk record number at which the index associated with the EDS begins.

If the data sequence of interest has just begun with the previous sample, controller 15 records the sample index at which the data sequence began in an EDS database.

As noted above, there must be a predetermined extraction algorithm that defines a data segment to be extracted. In general, an extraction algorithm defines the beginning and end of a data sequence that is to become an extracted data segment. The controller executing the extraction algorithm must be able to make the identification before the data sequence leaves FIFO buffer 12. The extraction algorithm preferably operates in real time. Real time trigger algorithms that identify the beginning of a sequence of interest in the input to an oscilloscope are known in the art. The trigger algorithms identify a feature as simple as a rising edge or as complex as a specific signal. In the system of the present disclosure, the extraction algorithm preferably selects a wide range of signals, since the exact nature of the data sequence of interest is not known in advance, and hence, a real time trigger algorithm that identifies a large class of signals is preferred. Note that the start of the data sequence that is to become an EDS need not occur on the sample that triggered the real time trigger. For example, the EDS could start a predetermined number of samples prior to the sample identified by the real time trigger.

The extraction algorithm must also specify the end of the data sequence of interest. In one exemplary embodiment, the extraction algorithm specifies a trigger and a window in the FIFO buffer 12. In this example, the EDS ends at the end of the window and all of the samples within the specified window are part of the EDS even though the signal of interest may terminate prior to the last data value in the window.

In another exemplary embodiment, the extraction algorithm specifies a trigger that signals the end of the data sequence to be extracted. For example, the extraction algorithm could require that data values constituting a falling edge that ends at a value below some threshold value and remains at or below that value for some specified number of samples signals the end of the data segment of interest. Accordingly, the EDS database also includes the length of the EDS or equivalent information such as the index of the last data sample in the EDS. In one exemplary embodiment, specifying the end of the EDS is also included in EDS database 19.

Once a new EDS is extracted, that EDS is compared to each RDS in a dynamically generated reference library. The RDS library includes an RDS database 18 that stores information about each RDS in the library. If the new EDS is sufficiently similar to one of the RDSs, the new EDS entry in the EDS database is updated to show that connection, and the RDS database is updated to show the identification of the new EDS as being part of a cluster associated with that RDS. If the new EDS is not sufficiently similar to one of the RDSs and sufficient processing time remains after comparing the new EDS with all of the RDSs in the RDS database, a new RDS is started using the new EDS as the RDS, and entering the relevant data in the RDS database. If sufficient processing time is not available, the new EDS entry in the EDS database is marked as having not been assigned. For example, a new EDS may be discovered during the matching of the EDS to the RDSs before all of the RDSs have been considered, and hence, controller 15 has to use the new EDS buffer for this new EDS.

At the beginning of the processing of the data stream, controller 15 receives a similarity measurement algorithm for measuring the similarity between two data segments.

In one aspect of the invention, the similarity algorithms generate a similarity measure that is compared to a threshold value in determining whether two data segments are similar. This algorithm is used by controller 15 to measure the similarity between an EDS and the RDSs in the RDS library. The similarity algorithms can be more easily understood by considering four types of algorithms. The first three types of algorithms operate on the data values themselves. The fourth type of algorithm operates on "signatures" that are derived from each data sequence.

The first type of similarity algorithm directly compares the data segments to determine their similarity. In the simplest case, the two data segments have the same length and the similarity function measures a distance between two vectors whose components are the data values. For example, if an EDS has sample values p(i) for i=1 to N, and the RDS has sample values q(i) for i=1 to N, the Euclidian distance $$D(p, q) = \sqrt{\sum_{i=1}^{N}(p(i) - q(i))^2}$$

is a measure of the degree of similarity of the two data segments. If D(p,q) is less than the threshold, T, the two segments are defined to be similar to one another, where T is a predetermined threshold value. There are many distance functions that can be used in place of the Euclidian distance for this purpose. As will be discussed in more detail below, in some applications, a particular distance function will be preferred because the computational workload in computing the function is less.

The second type of similarity function normalizes the data segments before measuring the distance between the data segments. In some applications, the shape of the data segments is more important than the exact matching of the data segments. For example, the data segments may represent two signals that differ in amplitude but have the same shape. That is, p(i)=Kq(i). If the user's goal is to look for signals having the same shape independent of the amplitudes of the signals, each data segment is first divided by a constant that depends on the average amplitude before computing the distance between the segments. In one example, the constant is the maximum value of the data segment. In another example, the constant is the average value of the absolute values of the data values in the data segment.

The third type of similarity function looks for a match between a smaller data segment and a larger data segment. This is useful in cases in which the user wants to find data segments that contain some smaller sequences. This situation arises when the data segments are of different lengths. Basically, the user wishes to look for a larger data sequence that contains a sequence that is similar to the smaller data sequence. In one example, the distance between the smaller data segment and a corresponding portion of the larger data segment is measured. If the smaller data segment is p(i) for i=1 to m, and the larger data segment is q(i) for i=1 to N, then a distance function $$D(p, q, k) = \sqrt{\sum_{i=1}^{m}(p(i+k) - q(i))^2}$$

can be defined for k=0 to (N−m−1). D is determined for the various values of k and the minimum value of D is chosen as the distance to be compared with the threshold. It should be noted that the procedure can be applied if the values of p and q can be normalized as described above. To reduce the processing time, k can be restricted to a small range. If the user has reason to believe that the two data sequences are aligned at the beginning, k can be restricted to zero.

The above similarity functions operate directly on the data segments being compared. This type of similarity function is intuitive for individuals that are not experts in clustering analysis. However, the workload to compute the similarity measures when classifying the EDSs can be large if the EDSs are large. In addition, depending on the type of similarity the user wishes to use to classify the EDSs, the fourth class of similarity function may be preferred.

In the fourth class of similarity analysis, a signature vector is derived from each data segment. The distance between the signature vectors can then be used to measure the similarity in a manner analogous to that described above. In this type of similarity measurement, the signature vectors for all of the EDSs have the same components, even if the data segments differ in length. In general, the number of components in a signature vector is much smaller than the number of data values in an EDS, and hence, the computational workload of performing the distance measurements is substantially reduced; however, this savings is offset by the computational workload of deriving the components of the signature vector from the corresponding data segment. In general, a component of the signature vector can be any function of the data segment that is likely to differentiate that data segment from other data segments. In the case in which the extraction algorithm generates data segments of different lengths, one component of a signature vector could be the length of the data segment. Other components can be derived from finite impulse response filters applied to the data segment. For example, components representing the amplitude of frequency components of the data segment can be used.

The processing of the data stream into classes can be viewed as a two phase-process. In the first phase, the EDSs are extracted from the data stream. It is assumed that the percentage of the data stream that is EDSs is relatively small. Hence, this phase is primarily a data reduction phase; however, there may be applications in which the entire data stream is recorded as described above.

In the second phase, the EDSs are assigned to classes using a clustering algorithm as discussed above. The time needed to complete this phase depends on the goal of the failure prediction system. If the goal is to research the classes that are seen prior to a failure of the component, the second phase can be completed off-line, as the classes are not used to predict failure, but rather to look for classes that predicted the failure after the failure. Since this mode waits for failure, it does not need to be completed in real time.

For the purposes of the present disclosure, a process is said to be carried out in real time if the process can be completed without reducing the rate with which the data stream enters the failure prediction system. In the case of the data extraction portion of the processing, the input data stream moves through a FIFO and then out to the disk storage; hence, during the extraction processing, i.e., identifying the new EDS, the controller must be able to identify the data segment that satisfies the extraction algorithm and move that data segment to a buffer in memory before part of the data segment moves out of the FIFO buffer.

The time to complete the preliminary classifications and update the RDS library depends on the amount of memory and the degree of parallel processing available. In addition, the time depends on the type of similarity computation that is utilized. For example, if each EDS is converted to a different vector for classification, such as a Fourier Transform of the observed EDS, the conversion time also increases the computational workload.

In one aspect, the new EDS is moved to EDS buffer 17 in memory and compared to the RDS in the library. The time needed to check a new EDS against the RDSs can be improved by keeping the RDSs in memory during the comparisons. In addition, the time to find a match can be improved by performing the matching in an order that reflects the likelihood of finding a match to an existing RDS. The RDS database includes a count of the EDS matches that have already been found for that RDS. Those counts are a measure of the likelihood that the corresponding RDS will be the match to the next EDS. Hence, performing the matching in the order of the counts associated with each RDS will improve the speed of finding a match, if one exists.

If the likelihood changes over time, a separate likelihood variable that decays over time can be utilized. Each time an EDS is assigned to an RDS, the likelihood count for that RDS is incremented by one. Periodically, the likelihood counts are reduced by multiplying the counts by a decay factor that is less than one. The search for a match is carried out in an order defined by the likelihood count.

Finally, it should be noted that the matching processing time can be reduced by parallel processing. The matching of the new EDS to one of the RDSs can proceed in parallel with the matching of the EDS to another of the RDSs. Hence, the matching time can be reduced by approximately a factor of M, where M is the number of parallel processors that are available. The distance computations can also be performed with the graphical processor cores in an advanced graphic display card; hence, the speed improvement through parallel processing can be a factor of more than 1000.

In the above-described embodiments, the reference database is empty at the start of the data recording operation. As new EDSs are encountered, some of the new EDSs become reference data segments. For example, the first EDS will become an RDS. The second new EDS may become a new RDS or just be labeled as part of the cluster represented by the previously created RDS.

Consider a system in which the results of failure analysis on a specific type of electronic component are known. These results will yield the types of clusters that are associated with the component at various stages of its lifecycle. The RDSs for these clusters can be initially loaded in the reference database. As new EDSs that belong to these clusters are seen, the state of the electronic component can be predicted, and thus provide the user with information on whether the component is likely to require maintenance in the near future.

As noted above, the clustering of the EDSs can be performed on the raw EDS or on some vector that is derived from the EDS. For example, a Fourier Transform of the EDS can be used as the vector in the clustering algorithm. The transform can have the same number and spacing of the tones even in the case in which the underlying EDSs have different lengths. For example, consider the case in which the component being monitored is a mechanical relay. Early in the lifecycle of the relay, the contacts exhibit a higher degree of "bounce" when the relay is activated. The bounce gives rise to high frequency components in the Fourier Transform. As the relay ages, the bounce becomes less pronounced, and hence, the high frequency components are reduced. The clusters of EDSs will show new clusters with less energy in the higher frequencies as the relay ages.

As noted above, new clusters that appear nearer to the point of failure may provide clues as to the predictors of component failure. This is particularly true for clusters that grow quickly near a point of failure. In one aspect of a system according to the present disclosure, a function $G_k(t)$ is defined for the $k^{th}$ cluster and measures the rate of growth of that cluster as a function of time. Here, k runs from 1 to the number of clusters present at time t. In one exemplary embodiment, the time axis is divided into a plurality of intervals, and the number of EDSs that are assigned to each cluster during an interval are counted. Denote the time in the middle of the $i^{th}$ time interval by $t_i$ and the number of EDSs assigned to the $k^{th}$ cluster in that time interval by $C_{k,i}$. In one example, $G_k(t_i)=AC_{k,i}$. Here, A is a normalization constant that takes into account the number of EDSs encountered in $i^{th}$ time interval. In one example, A is 1 divided by the sum of the number of EDSs encountered in the $i^{th}$ time interval.

In one aspect, a cluster in which $G_k(t_i)$ increases during the time periods near the failure of the cluster is flagged as a potential predictor of an upcoming failure. In one example, clusters in which $G_k(t_i)$ crosses a predetermined threshold level are flagged for further analysis. If a cluster exhibits an increasing $G_k(t_i)$ as a function of $t_i$, the cluster is flagged as a potential failure predictor. If a normal cluster (i.e., one that occurs early in the life cycle of the component, and hence, is presumed part of the normal operation) decreases during the time periods in which $G_k(t_i)$ increases above the threshold, then $G_k(t_i)$ is further identified as a potential predictor of failure.

In one aspect, a cluster population diagram is utilized to visualize the growth rate of various clusters. A cluster population diagram is defined to be a plot $G_k(t_i)$ as a function of $t_i$. The cluster population diagram allows a user to quickly identify clusters that are likely predictors.

In one aspect, the appearance of one or more $G_k(t_i)$ functions that are increasing and exceeding the threshold is sufficient to cause the user to replace the component either immediately or at the next scheduled maintenance interval.

As noted above, to compute the $G_k(t_i)$, the time axis is divided into a plurality of contiguous intervals, and the number of EDSs that were assigned to each cluster during each interval are counted. Hence, $G_k(t_i)$ represents an average over the time period in question. If the time period is too short, the statistical accuracy of the count will be too low. It should be noted that the time intervals do not need to be the same length, if the counts are also divided by the length of the time interval over which the count was generated. In one exemplary system, the total number of EDSs assigned to all clusters since the end of the last interval are computed. When this number reaches a sufficiently high value to ensure a desired statistical accuracy, the current time interval is terminated, and the corresponding $G_k(t_i)$ values are determined.

A simple example illustrates the use of the system according to the present disclosure to detect classes of EDSs that may predict aging or failure of a component. Consider an electro-mechanical relay that is activated by a fixed width control pulse. The output of the relay is monitored by a system according to the present disclosure. Ideally, the output of the relay consists of a signal whose amplitude remains constant during the control pulse and returns to zero when the control pulse is not present. The EDS trigger is activated by an output signal that is greater than some predetermined threshold value. The EDS includes the output of the relay during a fixed time period that includes the output of the relay. The fixed time period includes samples of the relay output from a starting time signal that is a fixed time prior to the trigger event to an ending time sample that is a fixed number of samples after the starting time sample.

Figure 2C:
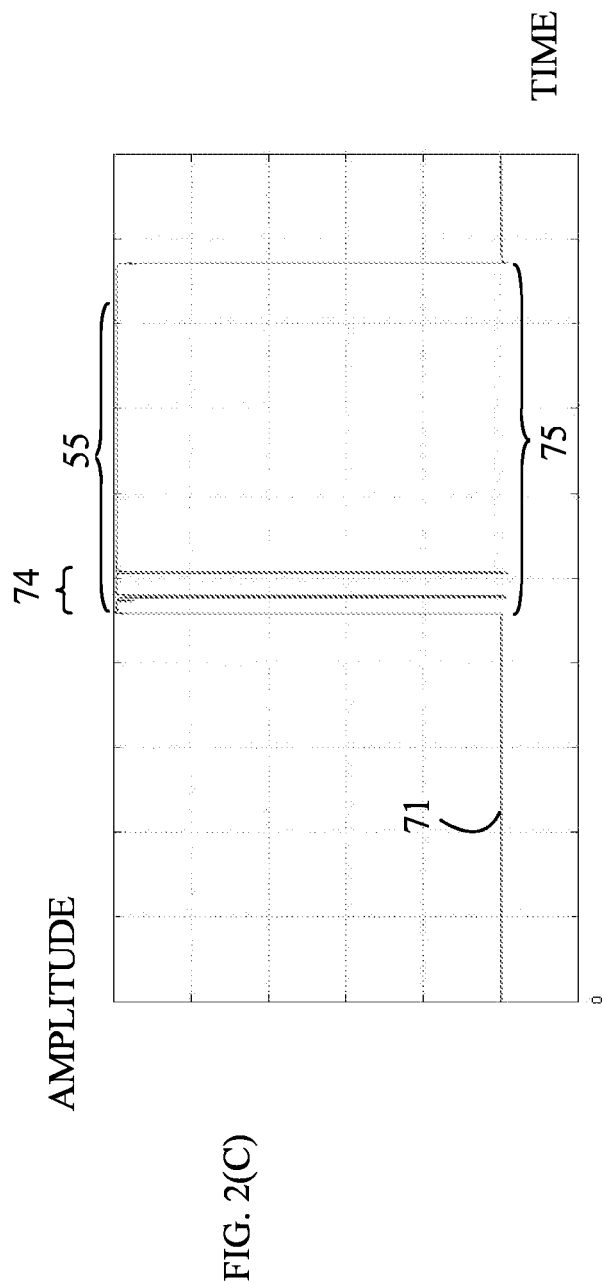

Refer now to FIGS. 2(A)-2(C), which illustrate three RDSs for three different clusters of EDSs that are observed when monitoring the output of the relay. RDS 52 represents a cluster of EDSs that are seen from the beginning of the recording of the output from the relay. The EDSs are extracted in response to the output crossing a fixed threshold that occurs at 53; however, a fixed portion of the output just prior to this crossing is also part of the EDS, and hence, the RDS.

Figure 3:
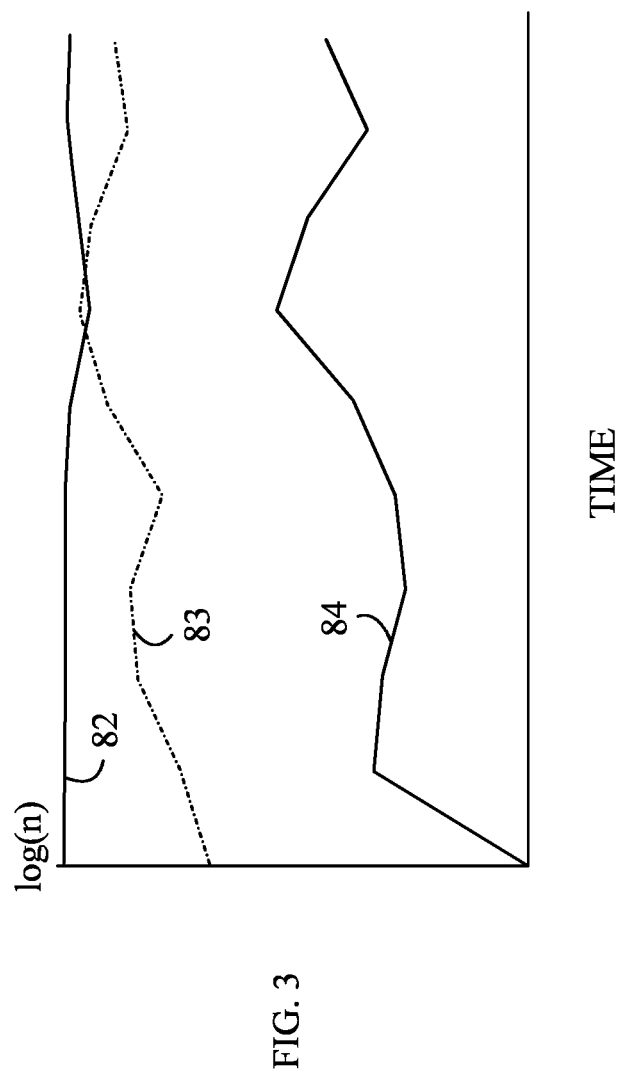
FIG. 3 illustrates a cluster population diagram for the clusters shown in FIGS. 2(A)-2(C) over a period of the recording in which the cluster shown in FIG. 2(C) has significant numbers of EDSs.

Refer now to FIG. 3, which illustrates a cluster population diagram for the clusters shown in FIGS. 2(A)-2(C) over a period of the recording in which the cluster shown in FIG. 2(C) has significant numbers of EDSs. The vertical axis in the plot is the log of the number of EDSs detected in each time interval. Curve 82 is the log of the counts for the cluster having RDS 52, curve 83 is the log of the counts for the cluster having RDS 62, and curve 84 is the log of the counts for the cluster having RDS 71. Curves 83 and 84 increase with time, while curve 82 decreases with time. The cluster associated with curve 84 could be a predictor of failure.

Given a cluster that could be a predictor of failure, the output of the electronic component can be monitored for EDSs that are in that cluster as an indication that the component could fail in the near future. However, such monitoring and clustering has a computational cost. Hence, it would be advantageous to examine the EDSs of the cluster to identify specific features of the EDSs that may predict failure and then provide a monitoring system that only looks for those features. In one aspect, the EDSs in the normal clusters are compared to the EDSs in the possibly predictive cluster to identify differences in the EDSs that may be directly monitored to predict failure.

Refer again to FIGS. 2(A)-(C). The initial output is characterized by a period 54 in which the relay contacts bounce. The output then becomes constant for a period of time and returns to the base level, since the EDS extraction algorithm extracts a fixed number of time samples. The RDS includes a number of samples that are taken after the relay returns to its non-activated state. The length of time that the relay output is above the threshold is shown at 55. This is also the time over which the activation signal is present in the case of RDS 52.

The RDS for another cluster that is seen as the relay ages is shown in FIG. 2(B). RDS 62 also exhibits a bounce period 64 at the beginning of the activation signal. The period of time over the relay remains "on" is shown at 65 and is slightly longer than that of RDS 52 shown in FIG. 2(A).

Refer now to FIG. 2(C), which illustrates an RDS 71 that is encountered much later in the recording. RDS 71 has far fewer bounces in region 74 than the RDS shown in FIGS. 2(A) and 2(B). In addition, the "on" time of the relay extends significantly beyond the control signal as shown at 75. For reference, the on time of the relay from FIG. 2(A) is shown at 55.

The above observations suggest that elongation of the "on" time and fewer bounces at the initial turn on can be used as predictive features that could be monitored in place of extracting the entire EDS and clustering the extracted EDSs. The computational workload to measure the difference between the activation signal and the "on" time of the relay and the number of bounces is significantly less than the computational workload of clustering all of the EDSs for the relay.

In one aspect of a system according to the present disclosure, the system includes a database, such as EDS database 19 discussed above, that identifies the time index of each EDS and the cluster to which it was assigned. This database allows the system to generate the $G_k(t_i)$ quickly without the need to read through the entire recording.

The database also facilitates changes to the clustering parameters and re-clustering the EDSs without reading through the entire recording. As noted above, the clustering can be performed on the raw EDSs or on some transform of the raw EDSs. For example, a Fourier Transform of each EDS could be performed and selected frequency bands within the transform used to generate a clustering vector representing the EDS. The database includes the location of each EDS in the data recording, and hence, the data can be re-clustered using the clustering vectors and analyzed as discussed above by retrieving each EDS from the recording using the time index associated with that EDS. The choice of the transform to be used can be provided by a user via user interface 21 shown in FIG. 1.

In the above examples, the EDSs are clustered with each cluster being represented by an RDS. In the more general case, each EDS is transformed to generate a CSV, and it is the CSVs that are clustered, with each cluster being represented by an RSV that is set to the CSV that starts that cluster. In the examples discussed above, the CSV for an EDS is set to the EDS itself, and the RSV becomes the EDS that starts each cluster. The RSV database stores the EDS location of the EDS that was transformed to the CSV so that that EDS can be retrieved if necessary.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A system for detecting an anomaly in an electronic component by analyzing an output of the electronic component or a device incorporating the electronic component during operation, said system comprising:
    an input port adapted for receiving a data stream, said data stream comprising an ordered sequence of data values generated by said electronic component; and
    a controller configured to:
    identify a new extracted data segment (EDS) of said data stream using an extraction protocol;
    transform said new EDS to a clustering signature vector (CSV), wherein said CSV comprises at least one component that is at least one function of said new EDS that differentiates said new EDS from other EDSs in said data stream;
    compare said CSV to a plurality of reference signature vectors (RSVs) using a first similarity protocol to determine if said CSV is similar to any RSV of said plurality of RSVs, wherein each RSV represents a cluster of CSVs;
    when said CSV is similar to an RSV of the plurality of RSVs, store information associating said CSV with the similar RSV in an RSV database;
    when said CSV is not similar to any RSV of the plurality of RSVs, create a new RSV for said CSV;
    predict that said electronic component will fail within a predetermined time period when the new RSV or the RSV with which the CSV is associated is a previously determined predictor RSV that occurs within the predetermined time period prior to failure of said electronic component; and
    notify a user of the predicted failure.

2. The system of claim 1 wherein said controller is further configured to transform said CSV corresponding to said new EDS to that new EDS.

3. The system of claim 1 wherein said controller is configured to transform said new EDS to said CSV by applying a Fourier Transform to said EDS.

4. The system of claim 1 wherein said data stream comprises a first period in which said electronic component is known to be operating correctly and a subsequent period in which said predictor RSV occurs.

5. The system of claim 4 wherein said data stream is divided into a plurality of contiguous intervals, and wherein each RSV of the plurality of RSVs is characterized by a count function that depends on a number of CSVs that were found to be similar to that RSV in each of said contiguous intervals, said predictor RSV having a count function that increases as a function of position in said data stream.

6. The system of claim 1 wherein said new EDS is identified using said extraction protocol comprises by selecting a fixed number of said data values from said ordered sequence of data values that include a data value associated with a trigger value specified by said extraction protocol.

7. The system of claim 1 wherein said ordered sequence of data values is copied to a storage medium and said system stores a location of each EDS in said storage medium.

8. A system for detecting an anomaly in an electronic component by analyzing an output of the electronic component or a device incorporating the electronic component during operation, the system comprising:
    an input port configured to receive a data stream comprising an ordered sequence of data values generated by the electronic component, wherein the data stream is divided into a plurality of contiguous intervals; and
    a controller configured to:
    identify a new extracted data segment (EDS) of said data stream using an extraction protocol;
    transform the new EDS to a clustering signature vector (CSV);
    compare the CSV to a plurality of reference signature vectors (RSVs) using a similarity protocol to determine if the CSV is similar to any RSV of the plurality of RSVs;
    when the CSV is similar to an RSV of the plurality of RSVs, store information associating the CSV with the similar RSV in an RSV database;
    when the CSV is not similar to any RSV of the plurality of RSVs, create a new RSV for the CSV; and
    predict that the electronic component will fail within a predetermined time period when the new RSV or the RSV with which the CSV is associated is a predictor RSV that occurs within the predetermined time period prior to failure of the electronic component as the electronic component ages; and
    notify a user of the predicted failure of the electronic component,
    wherein each RSV of the plurality of RSVs is characterized by a count function that depends on a number of CSVs that were found to be similar to that RSV in each of the plurality of contiguous intervals of the data stream, wherein the predictor RSV has a count function that increases as a function of position in the data stream.

9. The system of claim 8 wherein the controller is further configured to transform the CSV corresponding to the new EDS to that new EDS.

10. The system of claim 8 wherein the controller is configured to transform the new EDS to the CSV by applying a Fourier Transform to said EDS.

11. The system of claim 8 wherein the data stream comprises a first period in which the electronic component is known to be operating correctly and a subsequent period in which the predictor RSV occurs.

12. The system of claim 8 wherein the controller is configured to identify the new EDS using the extraction protocol by selecting a fixed number of the data values from the ordered sequence of data values that include a data value associated with a trigger value specified by the extraction protocol.

13. The system of claim 8 wherein the ordered sequence of data values is copied to a storage medium and a location of the EDS is stored in the storage medium.

* * * * *